US006343732B1

(12) United States Patent
Graves et al.

(10) Patent No.: US 6,343,732 B1
(45) Date of Patent: Feb. 5, 2002

(54) PASSIVE AND ACTIVE HEAT RETENTION DEVICE FOR SOLDER FOUNTAIN REWORK

(75) Inventors: Scott Peter Graves, Zumbro Falls; Phillip Duane Isaacs, Rochester, both of MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/410,404

(22) Filed: Oct. 1, 1999

(51) Int. Cl.[7] .......................... B23K 37/06; B23K 37/00
(52) U.S. Cl. ..................... 228/39; 228/44.7; 228/59; 118/504
(58) Field of Search ........................ 228/39, 37, 215, 228/264, 180.1, 44.3, 44.7, 59; 118/504, 301, 406

(56) References Cited

U.S. PATENT DOCUMENTS

| | | | | |
|---|---|---|---|---|
| 4,529,116 A | * | 7/1985 | Gutbier | |
| 5,704,535 A | * | 1/1998 | Thompson, Sr. | |
| 6,145,729 A | * | 11/2000 | Thompson, Sr. | |
| 6,145,733 A | * | 11/2000 | Streckfuss et al. | |
| 6,202,916 B1 | * | 3/2001 | Updike et al. | |
| 6,247,632 B1 | * | 6/2001 | Howell | |
| 6,267,288 B1 | * | 7/2001 | Chung | |

* cited by examiner

*Primary Examiner*—Tom Dunn
*Assistant Examiner*—Jonathan Johnson
(74) *Attorney, Agent, or Firm*—James R. Nock

(57) ABSTRACT

A method and apparatus for retaining heat at a pin-in-hole rework site on a printed circuit board during solder fountain rework of the board. A preheated heat retention plate is attached to the rework side of the printed circuit board. The heat retention plate covers a substantial portion of the board surface. During rework of the printed circuit board, the heat retention plate minimizes the temperature gradient between the rework site of the printed circuit board and the remainder of the printed circuit board. During the rework, the heat retention plate can be heated by an active heater in order to maintain a constant temperature gradient between the rework site of the board and the remainder of the board. By minimizing the escape of heat from the rework site, the number of solder cycles required to rework the board is decreased, resulting in reduced board rework times and increased board longevity.

10 Claims, 8 Drawing Sheets

PASSIVE AND ACTIVE HEAT RETENTION DEVICE FOR SOLDER FOUNTAIN REWORK

TECHNICAL FIELD

This invention relates generally to the manufacture and repair of printed circuit boards and more particularly relates to an apparatus and method for retaining heat at a pin-in-hole (PIH) rework site of a printed circuit board during solder fountain rework.

BACKGROUND OF THE INVENTION

As the complexity of today's printed circuit boards (PCBs) steadily increases, there is a corresponding increase in the manufacturing costs of producing the printed circuit boards. As a result, the high value of many printed circuit boards demands that they be repaired, wherever possible. In many instances, even less expensive printed circuit boards require repair (i.e., rework), because just-in-time manufacturing and tightly controlled production runs leave little room for shortage.

In a typical pin-in-hole printed circuit board rework procedure, a connector site to be reworked on the printed circuit board is fluxed to clean it by removing oxides prior to soldering. Fluxes consist of natural or synthetic rosins and chemical additives called activators, which remove oxides and keep the rework site clean during soldering. Reliable solder connections can only be accomplished with truly cleaned surfaces. Solvents could be used instead of fluxing to clean the surfaces prior to soldering, but are insufficient due to the rapid rate at which oxides form on the surface of heated metals.

After the connector site has been fluxed, the printed circuit board is placed in a solder fountain rework oven for preheating. The requirements of temperature and time for preheating depends on the printed circuit board construction, age, and exposure to the atmosphere. Preheating the printed circuit board serves several purposes. Preheating the board drives out volatile substances and/or moisture from the board which may cause expansion or delamination in the board when the board is rapidly heated. Preheating the board also prevents thermal shock to the board. Additionally, preheating allows pre-expansion of the printed circuit board prior to soldering. Finally, preheating raises the temperature of the printed circuit board and the component to be removed, enabling quicker component removal.

Next, a solder fountain system is turned on and the solder within the solder fountain system is allowed to reach the proper solder temperature. Solder is a metal alloy, typically made by combining lead, tin, and sometimes indium in different proportions. The proper solder temperature is a function of the proportions of elements used to form the solder. When hot solder contacts a copper surface, a metal solvent action takes place. The solder dissolves and penetrates the copper surface. The molecules of solder and copper blend to form a new alloy that is part copper and part solder. This solvent action is called wetting and forms the intermetallic bond between the parts.

After the solder fountain system reaches the proper temperature, the preheated printed circuit board is placed in the solder fountain system, and the rework procedure begins. In a typical rework procedure, a number of solder cycles are applied to the component on the printed circuit board in order to reflow and remove the component. Each solder cycle consists of a predefined contact time between the leads of the printed circuit board component and the solder, followed by a separation time. Ideally, the leads of the printed circuit board component should be just immersed and wetted without having the solder wave exerting any upward pressure on the printed circuit board which may damage the board. After the printed circuit board has been repaired, the printed circuit board is allowed to cool before handling. After cooling, the reflow area of the printed circuit board is cleaned and inspected for signs of damage.

Once solder fountain rework has been initiated on the printed circuit board, there is a fixed number of solder cycles that can be performed on the printed circuit board before the printed circuit board is irreparably damaged (i.e., each solder cycle increases the risk of damage to the plated through hole (PTH) and the laminate). Thus, it is desirable to perform the rework in the fewest number of solder cycles possible. The effects of solder cycles performed on the printed circuit board are cumulative during the remaining life of the board. Thus, if the printed circuit board is immediately reworked after manufacturing with a large number of solder cycles, the printed circuit board may be irreparable if a rework is required years later.

An important factor contributing to the number of solder cycles required to rework a connector site on the printed circuit board is the heat dissipation that occurs at a rework site during the rework procedure. During the localized rework of a component/connector site, the balance of the printed circuit board acts as a radiator, effectively drawing thermal energy away from rework site. As a result, additional solder cycles are required at the rework site in order to achieve the required reflow temperatures.

Preheating the entire printed circuit board in a solder fountain rework oven prior to rework initially provides some reduction in the flow of heat away from the rework site, but the printed circuit board quickly returns to an ambient temperature shortly after it is removed from the solder fountain rework oven. Thus, there is a need for an apparatus to minimize the dissipation of heat from the rework site of the printed circuit board during the rework procedure.

These and other objects, features and advantages of the present invention will be further described and more readily apparent from the summary, detailed description and preferred embodiments, the drawing and the claims which follow.

SUMMARY OF THE INVENTION

The present invention provides method and apparatus for retaining heat at a pin-in-hole rework site on a printed circuit board during solder fountain rework of the board. A preheated heat retention plate is placed in thermal proximity to the rework side of the printed circuit board. In one embodiment, heat retention plate is placed in direct contact with the rework side of the printed circuit board, and is held in place by heat resistant tape. In an alternate embodiment, a spacer is placed between the heat retention plate and the rework side of the printed circuit board, thus preventing direct contact between the heat retention plate and the back side components of the printed circuit board.

The heat retention plate transfers heat to a substantial portion of the board surface during the rework process. Thus, during rework of the printed circuit board, the heat retention plate minimizes the temperature gradient between the rework site of the printed circuit board and the remainder of the printed circuit board. During the rework, the heat retention plate can be heated by an active heater in order to maintain a constant temperature gradient between the rework site of the board and the remainder of the board. By minimizing the escape of heat from the rework site, the number of solder cycles required to rework the board is decreased, resulting in reduced board rework times and increased board longevity.

DETAILED DESCRIPTION OF THE INVENTION

Figure 1:
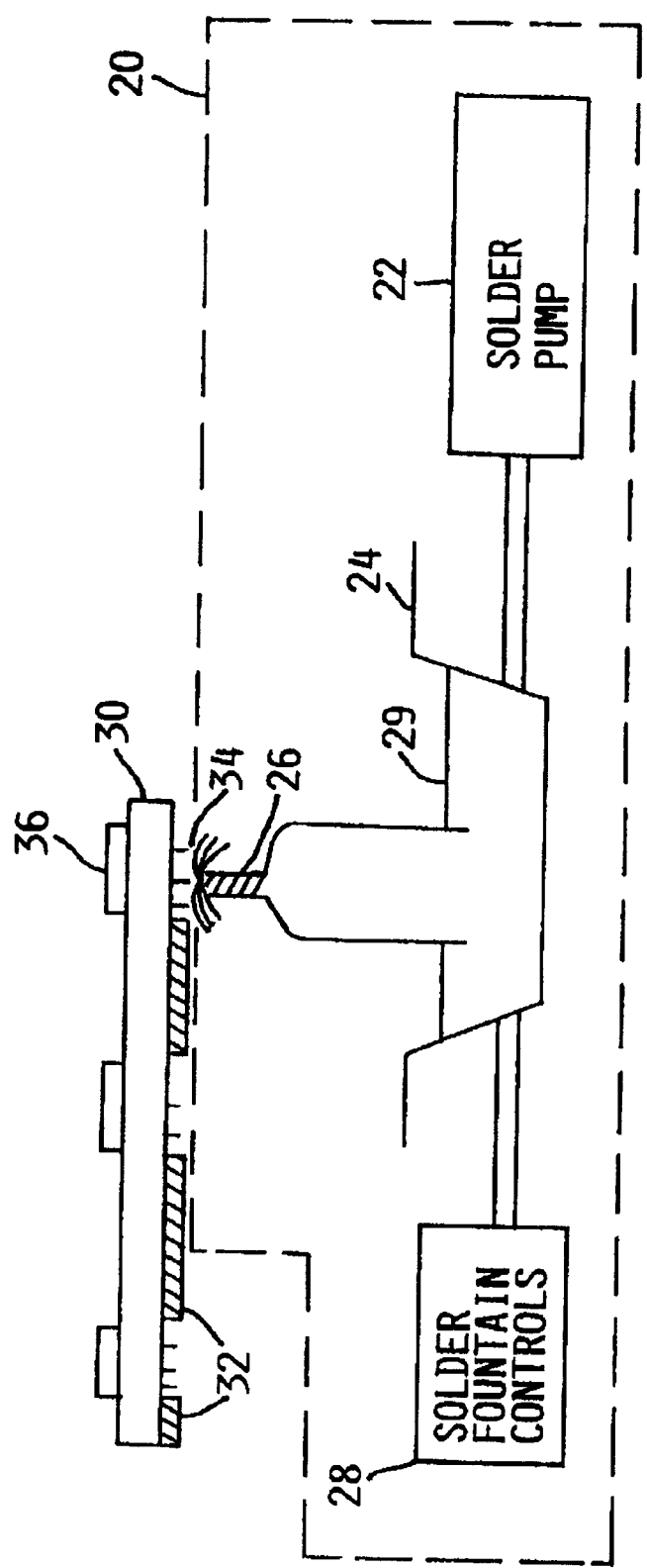
FIG. 1 is an illustration of a solder fountain system used to repair localized component/connector sites on a printed circuit board in accordance with the present invention.

FIG. 1 illustrates a solder fountain system as employed in the present invention. Most solder fountain systems 20 have the same basic components: a solder pump 22 and solder reservoir 24, various nozzles 26, and controls 28 for solder flow height and solder temperature. Solder 29 from the solder reservoir 24 is driven up through the nozzle 26 by the pump 22. Nozzles 26 are typically made of steel with welded seams and connections. The nozzle 26 construction allows for the capture of the pump's 22 inflow and for the runoff of the solder 29. This prevents excess splashing and maintains a usable solder level above the nozzle lip.

The solder height is typically set at 1.5 mm to 3.0 mm above the lip of the nozzle 26. Ideally, the leads of a printed circuit board component 36 should be just immersed and wetted without having the solder wave exerting any upward pressure on printed circuit board 30. A solder fountain table surface should be parallel to the nozzle 26 surface. Insufficient immersion prevents proper heat transfer and reflow. Excess pressure causes the solder to surge up through the holes and spill out onto the top side of the printed circuit board.

Solder fountain system 20 is typically set up to run in a cycle mode, where each solder cycle consists of a predefined contact time (e.g., approximately 5.5 seconds) between printed circuit board 30 and solder 29, followed by a separation time (e.g. 2–3 seconds). Additionally, printed circuit board 30 must be removed from the solder fountain and allowed to fully cool down (e.g., for approximately 15 minutes) after a series of approximately eight successive solder cycles.

In a typical printed circuit board rework procedure, approximately 12–20 cycles are required to rework a component/connector on printed circuit board 30 (i.e., remove a component/connector, remove the remaining retention hardware and remaining pins, and reflow the component/connector). Thus, it may take up to three series of solder cycles (i.e., over 30 minutes) to complete the rework of a component/connector site on printed circuit board 30.

However, if a heat retention plate 32 in accordance with the present invention is placed in thermal proximity to printed circuit board 30 during the rework operation, the number of cycles required during rework is reduced to approximately 7–8 cycles. Thus, the rework procedure can typically be performed within a single series of rework cycles, eliminating the need to cool down and reheat printed circuit board 30 between series of rework cycles. As described more fully in FIG. 2, heat retention plate 32 maintains a higher temperature across the entire surface of printed circuit board 30 during the rework procedure, thus reducing the loss of heat from the rework site.

Figure 2:
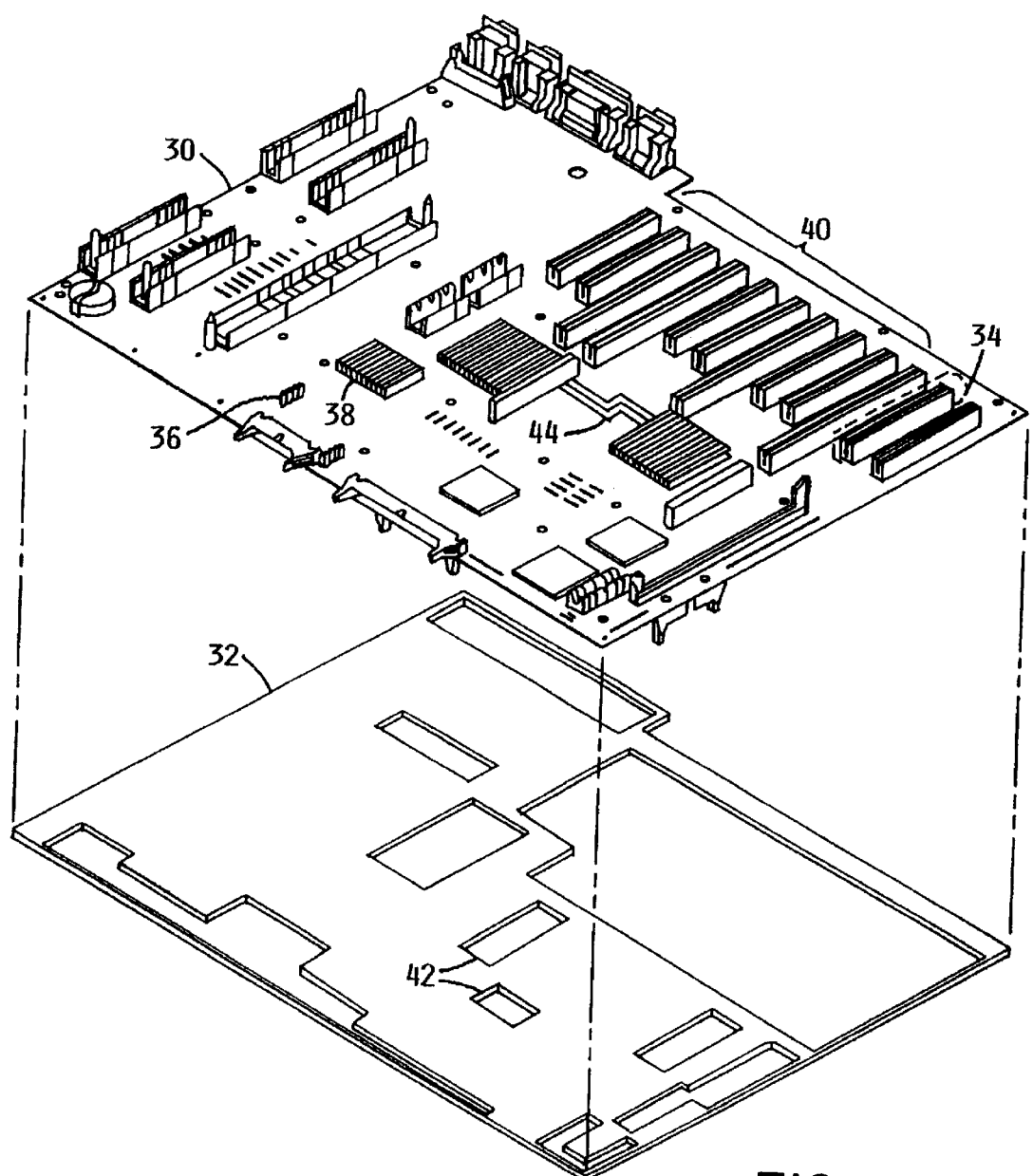
FIG. 2 is an illustration of a printed circuit board and a heat retention plate for retaining heat at a solder fountain rework site of the printed circuit board in accordance with the present invention.
Figure 5:
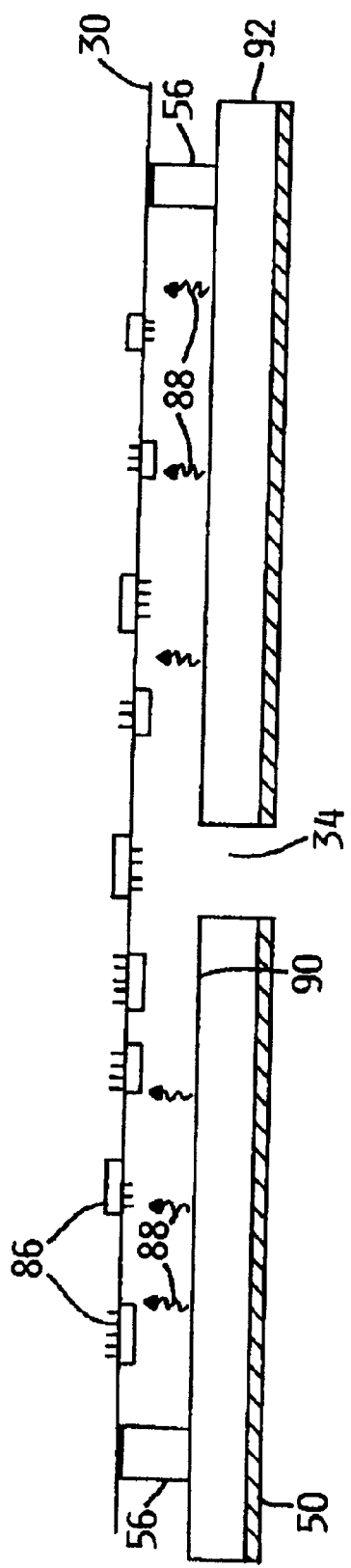
FIG. 5 is an illustration of one embodiment of the present invention, where the heat retention plate is used in conjunction with a printed circuit board having components on both sides.

FIG. 2 is an illustration of printed circuit board 30 and heat retention plate 32 for retaining heat at a solder fountain rework site 34 of printed circuit board 30. Printed circuit board 30 is typically a thin composite plate made of epoxy resin and fiberglass upon which integrated circuit chips 36, modules 38, connectors 40 and other electronic components are placed. Electronic components on printed circuit board 30 are linked together by a grid of conductive metal tracks and pads, shown generally at 44. In the illustrated embodiment, printed circuit board 30 is a single-sided board (i.e., all electronic components are placed on a single side of the printed circuit board), although two-sided printed circuit boards are also employed within the scope of the present invention, as illustrated in FIG. 5.

One technology in wide use for attaching electronic components 36, 38 and 40 to printed circuit board 30 is pin-in-hole technology (PIH). In PIH, electric drills bore holes in printed circuit board 30 at the points where electronic components 36, 38, and 40 are to be attached. Machines push leads (i.e., wires that come out of electronic components 36, 38, and 40) into and through the printed circuit board holes and bend them slightly so that they hold firmly in place. Electronic components 36, 38, and 40 are then fixed in place on printed circuit board 30 with solder, forming both a physical and electrical connection.

Most mass-produced pin-in-hole printed circuit boards 30 use wave soldering to attach electronic components 36, 38, and 40. A conveyer belt slides the entire printed circuit board 30 over a pool of molten solder (e.g., a tin and lead alloy), and a wave on the solder pool extends up to printed circuit board 30, coating the leads of electronic components 36, 38, and 40 and the circuit traces. When cool, the solder holds electronic components 36, 38 and 40 of printed circuit board 30 firmly in place.

Printed circuit boards 30 may require rework in order to correct problems with design defects, manufacturing defects, or defects encountered during use. Rework often involves the removal of an improperly installed or defective pin-in-hole electronic component 36, 38 and/or 40 from printed circuit board 30, and the subsequent re-installation and solder reflow of a replacement pin-in-hole electronic component 36, 38 and/or 40. The pin-in-hole rework process is highly localized (i.e., performed on a component by component basis), and requires high heat at the point of solder contact in order to reflow the solder for electronic component 36, 38, and 40 removal and replacement. Unfortunately, the balance of printed circuit board 30 acts as a heat sink during the reflow process, effectively drawing heat away heat from rework site 34, preventing rework site 34 from reaching an optimal reflow temperature.

As a result, the present invention provides a heat retention plate 32 to raise the temperature of the entire printed circuit board 30 during rework, in order to reduce the flow of heat away from rework site 34. In one embodiment of the present invention, heat retention plate 32 is an aluminum plate having a thickness ranging from approximately 0.15 of an inch to approximately 0.25 of an inch. In alternative embodiments, heat retention plate 32 is made of other materials having positive heat retention characteristics including, but not limited to: stainless steel and titanium.

Prior to the rework process, heat retention plate 32 is positioned in thermal proximity to circuit board 30 (i.e., positioned such that heat is transferred in a substantially uniform manner from heat retention plate 32 to a major surface of printed circuit board 30). In one embodiment of the present invention, heat resistant Kapton tape is applied around the perimeter edges of the printed circuit board 30 and heat retention plate 32 in order to attach printed circuit board 30 to heat retention plate 32. In alternative embodiments, printed circuit board 30 and heat retention plate 32 are attached by various means including, but not limited to: clamps, screws, bolts, and adhesives.

In one embodiment of the present invention, heat retention plate 32 has length and width dimensions substantially equal to the length and width dimensions of printed circuit board 30. By covering substantially the entire surface of printed circuit board 30, heat retention plate 32 provides uniform heating across the entire surface of printed circuit board 30. In alternative embodiments of the present invention, the length and width dimensions of heat retention plate 32 may be larger or smaller than corresponding length and width dimensions of printed circuit board 30. Heat retention plate 32 may directly contact a major surface printed circuit board 30, or alternatively, heat retention plate 32 may be offset from the major surface of the printed circuit board by one or more standoffs (i.e., typically employed when reworking two-sided circuit boards, as illustrated in FIG. 5). Heat retention plate 32 includes one or more openings 42 cut through the surface of the plate which enable access to the rework site on printed circuit board 30.

Figure 3:
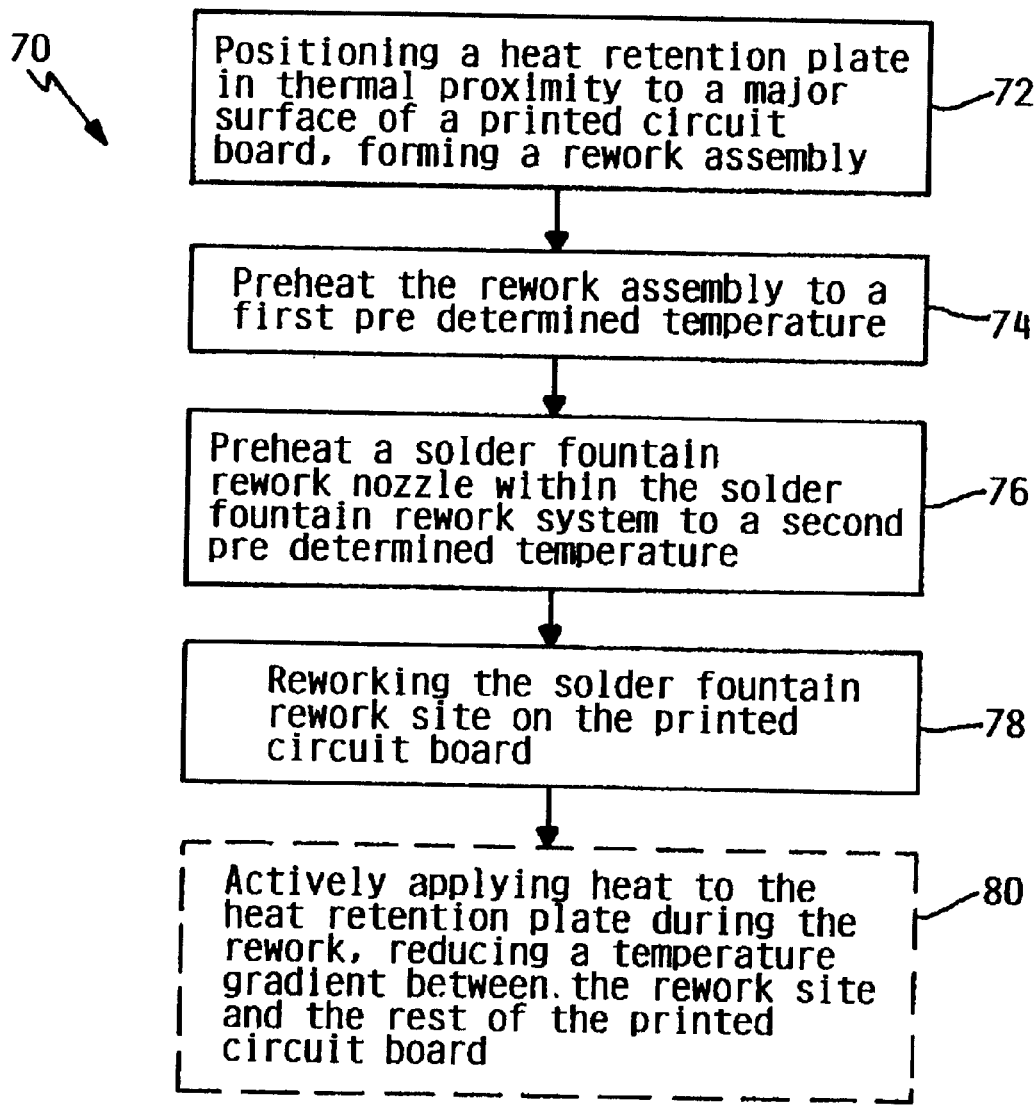
FIG. 3 is a flowchart illustrating a method of retaining heat at the solder fountain rework site of the printed circuit board in accordance with the present invention.

FIG. 3 is a flowchart illustrating a method of retaining heat at a solder fountain rework site of a printed circuit board, shown generally at 70. At block 72, the method begins by attaching heat retention plate 32 to a major surface of printed circuit board 30. Heat resistant tape 82 is applied between the perimeter edges of printed circuit board 30 and heat retention plate 32, forming a rework assembly.

Figure 4:
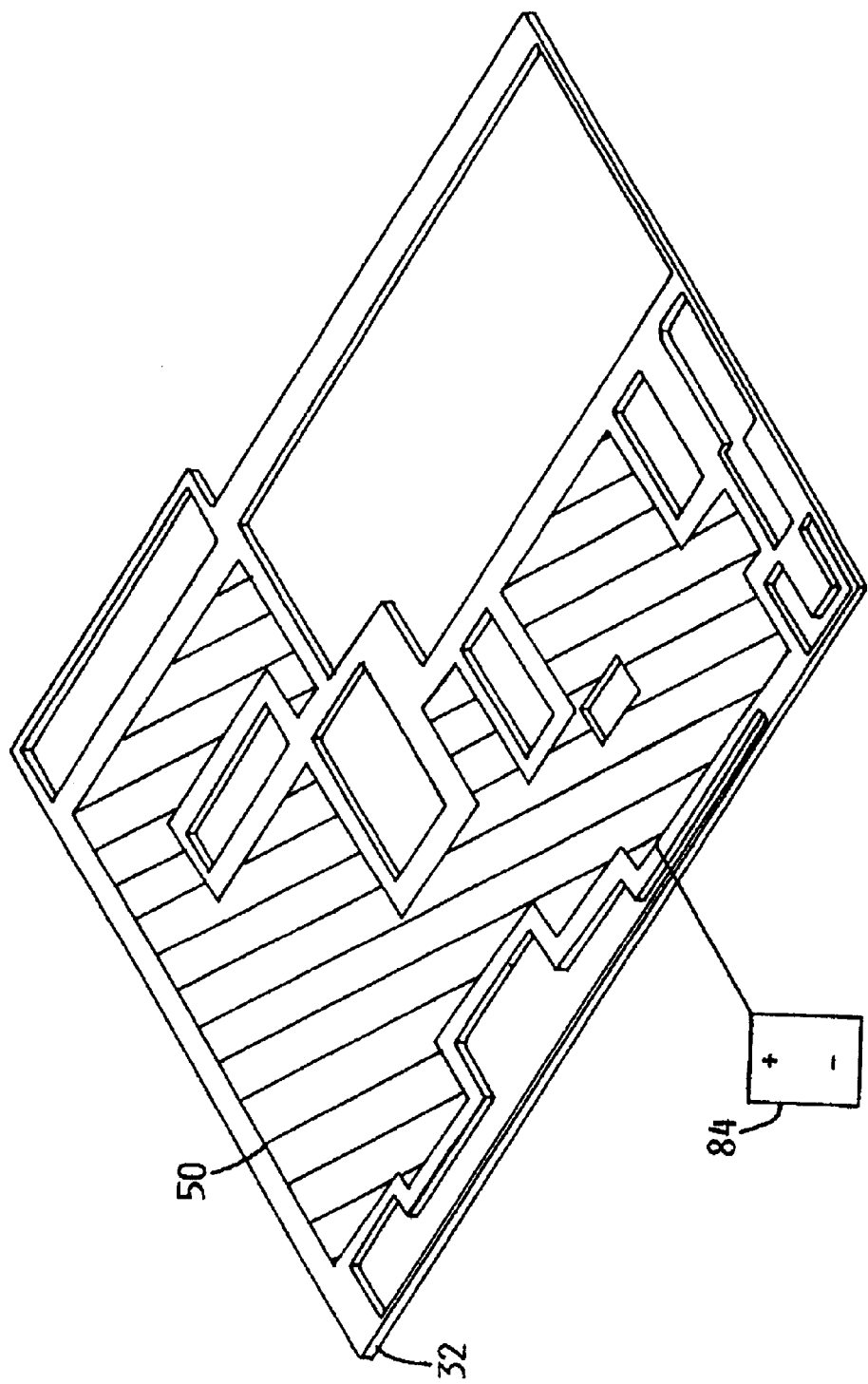
FIG. 4 is an illustration of one embodiment of the present invention, where a silicone rubber surface heater has been disposed over a major surface of heat retention plate.

After the rework assembly has been formed, it is preheated to a predetermined temperature, as described at block 74. The rework assembly can be preheated either passively by a solder fountain rework oven (not illustrated), or actively via a silicone rubber surface heater as illustrated in FIG. 4 to a predetermined temperature. In a preferred embodiment of the present invention, the predetermined temperature is approximately 125–150 degrees Celsius. By uniformly preheating the rework assembly to an elevated temperature before rework, the temperature gradient between printed circuit board rework site 34 and the remainder of printed circuit board 30 is reduced. As a result, the flow of heat away from rework site 34 during the solder fountain rework process is also substantially reduced.

After rework assembly 34 has been preheated to a predetermined temperature, solder fountain rework nozzle (FIG. 1, element 26) within a solder fountain rework system 20 is preheated to a predetermined temperature, as described at block 76. This is accomplished by first attaching a solder fountain rework nozzle 26 appropriately sized for the specific rework operation to solder fountain rework system 20. Next, solder 29 within solder fountain rework system 20 is preheated to a temperature appropriate for rework. In a preferred embodiment of the present invention, solder 29 employed within solder fountain rework system 20 is a composition including approximately fifty-four percent tin, approximately twenty-six percent lead, and approximately twenty percent indium. In one embodiment of the present invention, the rework temperature is approximately 400 degrees Fahrenheit. After solder 29 has reached the rework temperature, solder fountain rework system 20 is switched to a continuous mode of operation for approximately three minutes to preheat solder fountain rework nozzle 26 to a predetermined temperature (e.g., approximately 400 degrees Fahrenheit).

After solder fountain rework nozzle 26 has been preheated to the proper temperature, solder fountain rework site 34 on printed circuit board 30 is reworked, as illustrated at block 78. The rework process begins by switching solder pump 22 within solder fountain rework system 20 to a cycle mode. In the cycle mode, the solder fountain provides approximately 5.5 seconds of contact between the molten solder and rework site 34 on the printed circuit board, followed by a separation time of approximately two to three seconds. After a sequence of approximately four reflow cycles of contact between molten solder 29 and the electrical component at rework site 34, the electrical component at rework site 34 of printed circuit board 30 is removed. The number of reflow cycles required to remove the electrical component will vary according to numerous factors, including: the solder composition and reflow temperature; the printed circuit board thickness, composition and ambient temperature; and the size and pin count of the electrical component. After approximately two additional reflow cycles, any remaining hardware and pins from rework site 34 are removed. After the electrical components and remaining hardware have been removed, a replacement electrical component is inserted at the rework site, and the replacement electrical component is reflowed for approximately one additional cycle. After the replacement electrical component has been reflowed, printed circuit board 30 is cooled and washed.

In contrast to the twelve to twenty rework cycles required to rework printed circuit board 30 under traditional rework processes, the present invention typically requires less than eight rework cycles. As a result, no lengthy cooling of printed circuit board 30 between sequences of rework cycles is required, resulting in quicker rework turnaround times. Moreover, the cumulative detrimental effect of rework cycles on the life of printed circuit board 30 is reduced.

Block 80 describes an optional method step wherein heat is actively applied to heat retention plate 32 during the rework, thereby maintaining a reduced temperature gradient between rework site 34 and the rest of the printed circuit board 30 for the duration of the rework operation. In one embodiment of the present invention, heat is actively applied to heat retention plate 32 during rework via a silicone rubber surface heater disposed over a major surface of heat retention plate 32, described subsequently in FIG. 4.

FIG. 4 is an illustration of one embodiment of the present invention, where silicone rubber surface heater 50 has been disposed over a major surface of heat retention plate 32. Silicone rubber surface heater 50 serves two major functions within the present invention: preheating heat retention plate 32 to a pre-determined temperature (e.g., 125 degrees C.) prior to the rework process; and maintaining heat retention plate 32 at the pre-determined temperature during the rework process.

In one embodiment, silicone rubber surface heater 50 is disposed on the surface of heat retention plate 32 such that the majority of the surface of heat retention plate 32 is covered by silicone rubber surface heater 50. Silicone rubber surface heater 50 is electrically coupled to a power source 84 such that when the power is applied to the silicone rubber surface heater 50, heat is transferred from silicone rubber surface heater 50 to heat retention plate 32.

Actively preheating heat retention plate 32 by silicone rubber surface heater 50 offers two significant advantages over passive preheating heat retention plate 32 via the solder fountain rework oven. First, silicone rubber surface heater 50 actively preheats heat retention plate 32 significantly faster than passive preheating via the solder fountain rework oven. Second, silicone rubber surface heater 50 maintains the global temperature of the entire printed circuit board 30 within a tighter tolerance than can be provided by the solder fountain rework oven.

FIG. 5 is an illustration of one embodiment of the present invention, where heat retention plate 92 is used in conjunction with a two-sided printed circuit board 30. In the illustrated embodiment, printed circuit board 30 includes pin-in-hole or surface mount components 86 mounted on both sides of printed circuit board 30. As a result, heat retention plate 92 cannot directly contact either surface of printed circuit board 30, since pin-in-hole components 86 extend from both sides of printed circuit board 30. Additionally, direct contact between heat retention plate 92 and the top surface of pin-in-hole components 86 is potentially damaging to the components. As a result, heat retention plate 92 is offset from the rework surface of the two-sided printed circuit board by a spacer 56.

In one embodiment of the present invention, spacer 56 is a removable block placed between printed circuit board 30 and heat retention plate 92 prior to attaching printed circuit board 30 to heat retention plate 92. In an alternative embodiment, spacer 56 is integrated within heat retention plate 92. Spacer 56 is positioned such that it contacts printed circuit board 30 in an area where direct contact will not damage any pin-in-hole components 86. Spacer 56 has a height sufficient to prevent direct contact between heat retention plate 92 and printed circuit board 30, yet still allows radiant heat conductivity 88 between heat retention plate 92 and printed circuit board 30. Thus, while heat retention plate 32 illustrated in FIG. 2 transfers heat to printed circuit board 30 through direct contact, heat retention plate 92 of the present embodiment transfers radiant heat 88 to printed circuit board 30 without direct surface contact. In one embodiment, the radiant surface of heat retention plate 90 (i.e., the surface closed to printed circuit board 30) is painted black to provide superior heat radiation characteristics. In the illustrated embodiment, heat retention plate 92 is passively heated by the solder fountain rework oven prior to rework (not illustrated), or is actively heated by silicone rubber surface heater 50, as previously illustrated in FIG. 4.

Figure 6A:
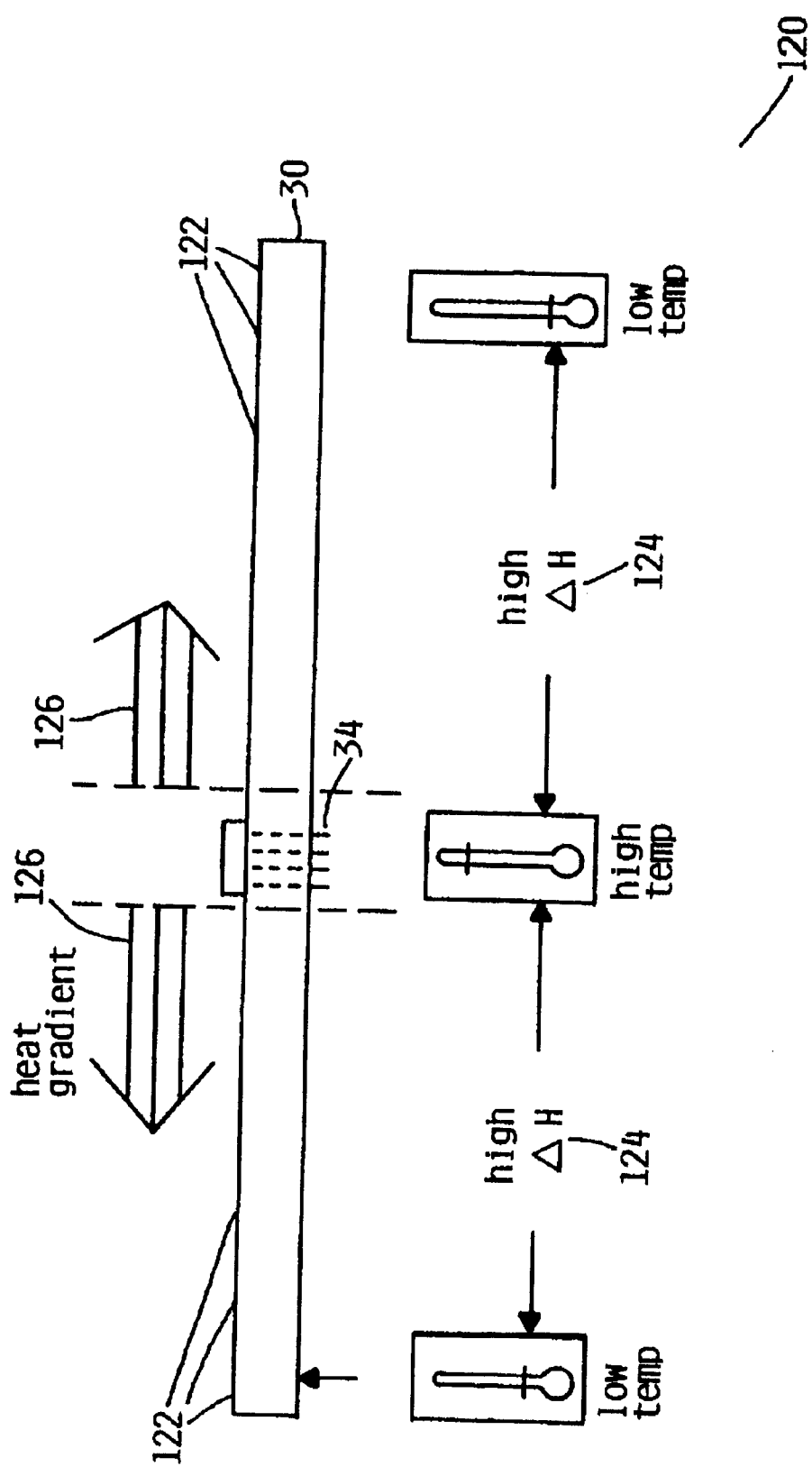
FIGS. 6A, 6B, and 6C respectively illustrate the flow of heat away from the rework site of a printed circuit assembly where no heat retention apparatus is employed, where a passive heat retention apparatus is employed, and where an active heat retention apparatus is employed.

FIG. 6A illustrates the flow of heat away from rework site 34 of printed circuit board 30 where no heat retention apparatus is employed, as illustrated generally at 120. In this illustration, there is a large temperature differential 124 between rework site 34 of printed circuit board 30 and a remainder area 122 of printed circuit board 30. Even if printed circuit board 30 is preheated in the solder fountain rework oven prior to the rework process, the printed circuit board possesses poor heat retention characteristics, and quickly loses heat. As heat is quickly drawn away from the high temperature rework site 34 to the remainder of printed circuit board 30, it becomes much more difficult to achieve an optimal solder reflow temperature at rework site 34. As a result, a relatively large number of solder fountain rework cycles are required to remove and rework the component/connector at rework site 34.

Figure 6B:
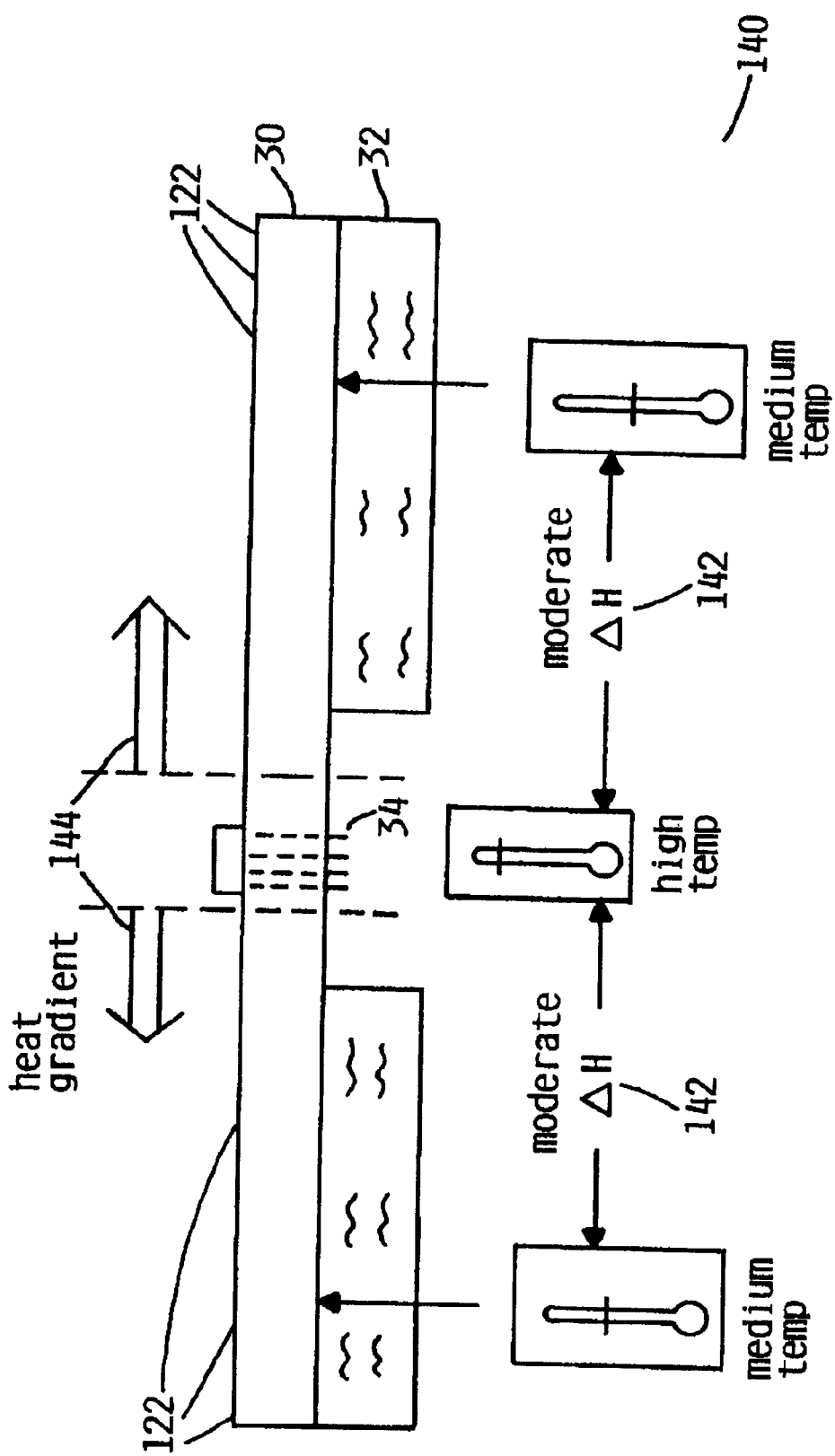

FIG. 6B illustrates the flow of heat away from rework site 34 of printed circuit board 30 where a passive heat retention apparatus (i.e., heat retention plate 32) is employed, as shown generally at 140. In this illustration, both printed circuit board 30 and heat retention plate 32 are heated to an elevated temperature prior to performing a rework operation at rework site 34. Heat retention plate 32 possesses relatively high heat retention characteristics which counteract the relatively low heat retention characteristics of printed circuit board 30. As a result, heat is transferred from heat retention plate 32 to printed circuit board 30 during the rework operation, maintaining the entire printed circuit board at a somewhat elevated temperature for the duration of the rework operation. Since a smaller heat differential 142 exists between rework site 34 and the remainder 122 of printed circuit board 30 than existed in FIG. 6A, less heat is drawn away from rework site 34 to the remainder of printed circuit board 30 during the rework operation (as shown at 144). However, even though heat retention plate 32 slows the loss of heat from printed circuit board 30 during the rework operation, the amount of heat generated by heat retention plate 32 gradually dissipates with the passage of time. Thus, for extended rework operations, the passive heat retention apparatus may lose its effectiveness.

Figure 6C:
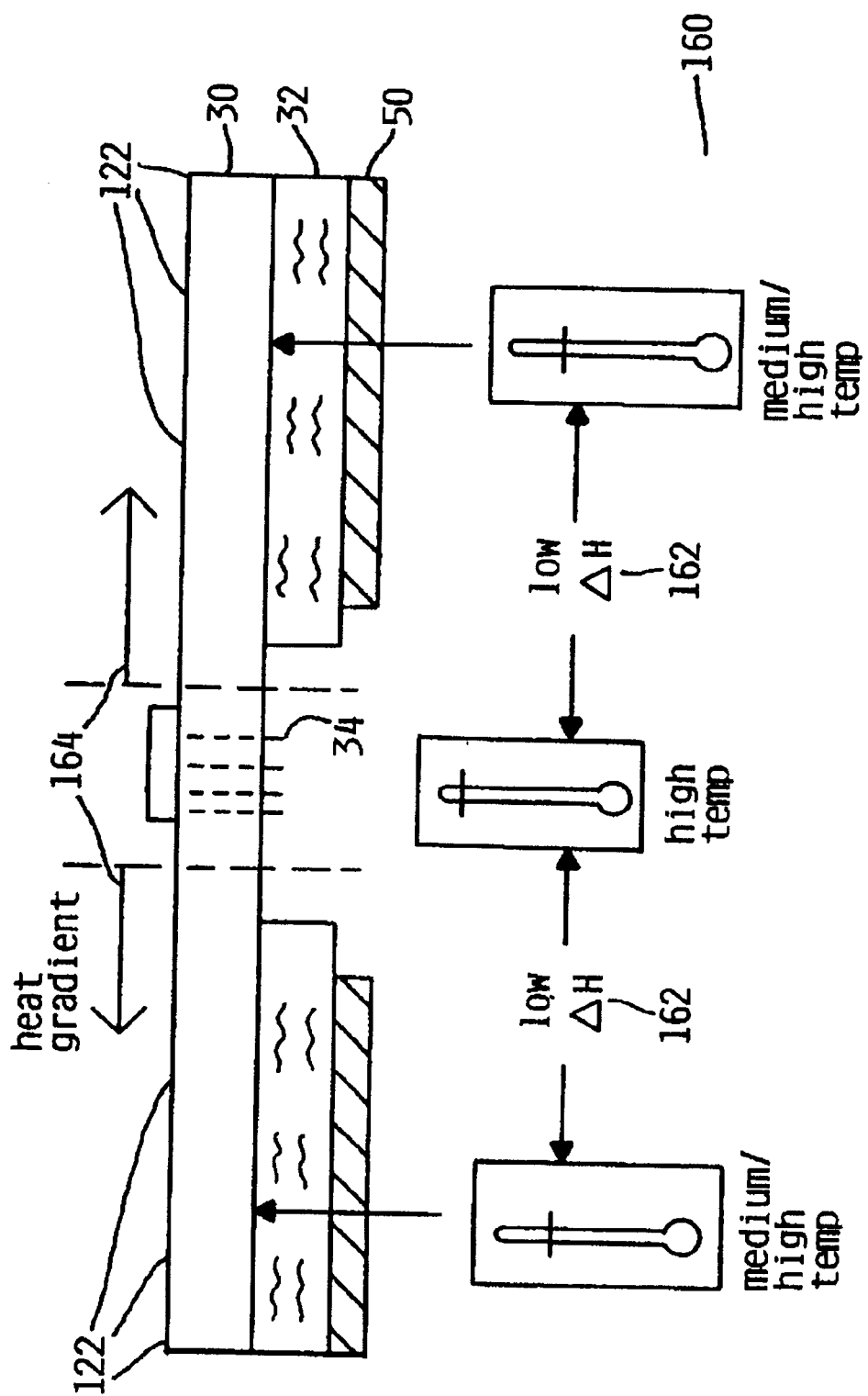

FIG. 6C illustrates the flow of heat away from rework site 46 of printed circuit board 30 where an active heat retention apparatus (i.e., a silicone rubber plate heater 50 attached to heat retention plate 32) is employed, shown generally at 160. In this illustration, silicone rubber plate heater 50 actively applies heat to heat retention plate 32 throughout the rework process. Thus, in this illustration, the heat retention plate maintains a relatively constant temperature throughout the entirety of the rework process, resulting in a minimal temperature differential 162 between rework site 34 and remainder 122 of printed circuit board 30. In this example, the loss of heat from rework site 34 is minimized (as shown at 164), resulting in fewer rework cycles required to perform the rework operation.

The present invention, therefore, is well adapted to carry out the objects and attain the ends and advantages mentioned, as well as others inherent therein. While presently preferred embodiments of the present invention have been described for the purpose of disclosure, numerous other changes in the details of construction, arrangement of parts, compositions and materials selection, and processing steps can be carried out without departing from the spirit of the present invention which is intended to be limited only by the scope of the appended claims.

What is claimed is:

1. An apparatus for retaining heat at a solder fountain rework site of a printed circuit assembly, the apparatus comprising:

a printed circuit board having a first major surface and a second major surface;

a heat retention plate; and a positioner for positioning the heat retention plate in thermal proximity to the printed circuit board, wherein the positioner enables direct physical contact between the heat retention plate and the second major surface of the printed circuit board, wherein the positioner comprises heat resistant tape applied around the perimeter of the printed circuit board and the heat retention plate, thereby coupling the second major surface to the printed circuit board to the heat retention plate.

2. The apparatus of claim 1, wherein the positioner physically separates the heat retention plate from the majority of the second major surface of the printed circuit board.

3. The apparatus of claim 2, wherein the positioner comprises a spacer inserted between the heat retention plate and the second major surface of the printed circuit board.

4. The apparatus of claim 1, wherein the retention plate includes one or more openings for providing access to a solder fountain rework site on the second major surface of the printed circuit board.

5. The apparatus of claim 1, wherein the heat retention plate has a length dimension and a width dimension approximately equal to a length dimension and a width dimension of the printed circuit board.

6. The apparatus of claim 1, wherein the heat retention plate is made of aluminum.

7. The apparatus of claim 6, wherein the heat retention plate has a thickness in a range from approximately 0.15 of an inch to approximately 0.25 of an inch.

8. The apparatus of claim 1, further comprising an active heater coupled to the heat retention plate.

9. The apparatus of claim 8, wherein the active heater is a silicone rubber heater disposed over a major surface of the heat retention plate.

10. The apparatus of claim 9, wherein the silicone rubber heater covers a majority of the major surface of the heat retention plate.

* * * * *